United States Patent
Kojer et al.

(10) Patent No.: US 9,912,333 B2
(45) Date of Patent: Mar. 6, 2018

(54) HOUSEHOLD APPLIANCE WITH CONTROL ELEMENT

(75) Inventors: Mario Kojer, Tacherting (DE); Andreas Marbach, Traunwalchen (DE)

(73) Assignee: BSH Hausgeräte GmbH, Munich (DE)

( * ) Notice: Subject to any disclaimer, the term of this patent is extended or adjusted under 35 U.S.C. 154(b) by 397 days.

(21) Appl. No.: 14/238,201

(22) PCT Filed: Aug. 28, 2012

(86) PCT No.: PCT/EP2012/066637
§ 371 (c)(1),
(2), (4) Date: Feb. 11, 2014

(87) PCT Pub. No.: WO2013/030170
PCT Pub. Date: Mar. 7, 2013

(65) Prior Publication Data
US 2014/0197019 A1    Jul. 17, 2014

(30) Foreign Application Priority Data
Aug. 30, 2011 (DE) .................. 10 2011 081 767

(51) Int. Cl.
*H03K 17/96* (2006.01)
*F24C 15/10* (2006.01)
*F24C 7/08* (2006.01)

(52) U.S. Cl.
CPC ......... *H03K 17/9622* (2013.01); *F24C 7/083* (2013.01); *F24C 15/102* (2013.01)

(58) Field of Classification Search
CPC combination set(s) only.
See application file for complete search history.

(56) References Cited

U.S. PATENT DOCUMENTS

| 3,005,109 | A | * | 10/1961 | Funkhouser | H02J 3/14 |
| | | | | | 219/485 |
| 4,345,145 | A | * | 8/1982 | Norwood | A47J 37/0623 |
| | | | | | 219/408 |
| 4,816,647 | A | * | 3/1989 | Payne | F24C 15/106 |
| | | | | | 219/448.12 |
| 5,961,867 | A | * | 10/1999 | McWilliams | H05B 3/746 |
| | | | | | 219/446.1 |

(Continued)

FOREIGN PATENT DOCUMENTS

DE     19918290 C1    1/2001
DE    102005040206 A1    2/2007

(Continued)

OTHER PUBLICATIONS

International Search Report PCT/EP2012/06637 dated Nov. 12, 2012.

*Primary Examiner* — Anne M Antonucci
*Assistant Examiner* — Renee LaRose
(74) *Attorney, Agent, or Firm* — Michael E. Tschupp; Andre Pallapies; Brandon G. Braun

(57) ABSTRACT

A household appliance includes at least one control element for modifying at least one operating parameter of the household appliance. At least one modification of at least one operating parameter which modification has been executed last is resettable by a reset control element. In a method for operating a domestic appliance, a most recently executed modification of an operating parameter can be reset by an operator.

18 Claims, 3 Drawing Sheets

(56) References Cited

U.S. PATENT DOCUMENTS

| | | | | |
|---|---|---|---|---|
| 6,061,810 | A * | 5/2000 | Potter | G06F 11/0721 |
| | | | | 714/23 |
| 6,396,032 | B1 * | 5/2002 | Denny | F23N 5/242 |
| | | | | 219/414 |
| 6,841,760 | B2 * | 1/2005 | Whipple, Jr. | F24C 7/087 |
| | | | | 219/395 |
| 7,346,434 | B2 * | 3/2008 | Goza | G05D 7/0635 |
| | | | | 700/282 |
| 7,646,230 | B2 * | 1/2010 | Parfitt | G05B 19/054 |
| | | | | 327/265 |
| 7,786,400 | B2 * | 8/2010 | Baier | F24C 7/082 |
| | | | | 200/511 |
| 8,450,879 | B2 * | 5/2013 | Chilvers | H02H 3/334 |
| | | | | 307/116 |
| 8,581,137 | B2 * | 11/2013 | Egenter | F24C 7/083 |
| | | | | 219/100 |
| 8,710,406 | B2 * | 4/2014 | Sanders | H02J 3/14 |
| | | | | 219/200 |
| 2004/0068678 | A1 * | 4/2004 | Li | G06F 11/3612 |
| | | | | 714/38.1 |
| 2004/0159650 | A1 * | 8/2004 | Steiner | G05D 23/1909 |
| | | | | 219/448.13 |
| 2006/0231375 | A1 | 10/2006 | Kleinhans | |
| 2008/0133789 | A1 * | 6/2008 | McNutt | G05B 19/054 |
| | | | | 710/30 |
| 2012/0027904 | A1 | 2/2012 | Lim | |

FOREIGN PATENT DOCUMENTS

| | | |
|---|---|---|
| DE | 102007008896 A1 | 8/2008 |
| DE | 102008032449 A1 | 1/2010 |
| EP | 0976862 B1 | 10/2004 |
| WO | 2008074582 A1 | 6/2008 |

* cited by examiner

HOUSEHOLD APPLIANCE WITH CONTROL ELEMENT

BACKGROUND OF THE INVENTION

The invention relates to a household appliance with at least one control element for modifying at least one operating parameter of the household appliance. The invention further relates to a method for operating a household appliance.

It is known that if a control element which is provided for modifying at least one operating parameter of the household appliance is not operated correctly, an operator or user must reset this operating parameter. The difficulty which arises in such cases is that the operator frequently no longer remembers the value of the operating parameter set incorrectly by the incorrect operation of the control element. It can even occur that a number of operating parameters are set incorrectly by the incorrect operation of a control element, which further complicates making a new setting.

The task of the present invention is to overcome the disadvantages of the prior art, at least in part.

BRIEF SUMMARY OF THE INVENTION

This object is achieved by the features of the independent claims. Preferred embodiments are especially to be taken from the dependent claims.

The object is achieved by a household appliance with a least one control element for modifying at least one operating parameter of the household appliance. The household appliance also has at least one reset control element which is intended for resetting at least one most recently carried out modification. This gives the advantage that the operator no longer has to remember the incorrectly set value but merely needs to actuate the reset control element in order to return the value to its original setting. Such resetting is also able to be executed especially easily, especially with a few actuations.

A control element can for example be understood as a physical control element, e.g. a switch, a button, a slider etc., or also a control panel of a sensor array etc. for example.

The reset control element can especially be embodied as a separate switch or button. The switch or the button might be a physical switch or button or might for example be a control area of a sensor array. The reset control element might be one function of a multifunction button.

The resetting of at least one modification recently carried out can include the resetting of just one modification, the last one carried out.

One embodiment is that the reset control element is configured for resetting a number of recently carried out modifications, e.g. the last two, three or more modifications carried out. The resetting of a number of modifications can for example be undertaken by actuating the reset control element just as frequently and/or by a longer-duration actuation of the reset control element if the reset control element is equipped with what is referred to as a repeat function.

Another embodiment is that a modification of the at least one operating parameter is undertaken as a result of precisely one actuation of an associated control element.

Another embodiment is that the at least one operating parameter is modified as a result of a number of consecutive actuations of the at least one control element, wherein two actuations carried out directly one after the other do not extend beyond a predetermined period of time. This enables series of actuations which are carried out one after the other in a sufficiently rapid sequence to be canceled or reset with a single actuation of the reset control element. In such cases the content relationship between these actuations is established by the sufficiently rapid sequence, wherein the "sufficiently rapid" sequence is determined by the first predefined period of time.

A further embodiment is that the predefined period of time amounts to at least approximately one second, especially at least approximately three seconds, especially approximately five seconds.

A further embodiment is that a modification is able to be reset up to a second predefined period of time. The advantage achieved by this is that a reset is only carried out for changes which do not lie too far back and consequently make little sense for a current situation. For example by switching off a heat setting of a cooking device a temperature of the cooked item might have cooled down so far after five minutes that simply resetting it to its previous state would no longer produce a satisfactory cooking result.

A development is that the second predefined period of time lies between thirty seconds and ten minutes, especially lasts for at least one minute, especially approximately five minutes.

A development is that the second predefined period of time is dependent on an operating state and/or a modification of the operating state of the household appliance. Thus the household appliance can recognize this operating state (e.g. on the basis of operating parameters set) and automatically assign an associated second predefined period of time, especially assigned automatically by the household appliance. This makes possible an especially effectively assigned resetting. For example the second predefined period of time can be set for a cooktop as a function of a value of a heat setting before a modification, after the modification and/or of the extent of the modification.

Another embodiment is that a modification is able to be reset after the household appliance is switched off up to a third predefined period of time, which is especially shorter than the second predefined period of time. The provision of the third predefined period of time prevents a household appliance deliberately switched off and switched back on again much later being reset to operating parameter values before it was switched off.

A development is that the third predefined period of time amounts to a maximum of around one minute. For example the household appliance can in this way be switched back on after a switch off before the third period of time is reached or exceeded and can be reset by means of the reset control element again at least to the state obtaining before the switch-off.

The domestic appliance can be switched on and reset to the operating parameter values valid before the switch-on for example by actuating the main switch and then the reset control element or by actuating only the reset control element (especially within the third predefined period of time). These alternatives are especially also provided for the case in which the switching off has been carried out automatically especially after a long continuous actuation has been identified.

A further development is that modifications made during normal operation are able to be reset by means of the reset control element. Normal operation can especially be understood as operation between switching on and switching off the household appliance. A specific development is that only modifications made during normal operation are able to be reset. In this case in particular modifications made after switching off the household appliance may no longer be reset, for example since an associated memory or memory area is erased with the switching off.

An embodiment is also that specific modifications (especially modifications of specific parameters) are able to be reset and other modifications (especially modifications of other parameters) are not able to be reset. This enables the resetting to be designed in an even more user-friendly way. This exploits the fact that a few operating parameters are able to be reset simply and intuitively, while resetting of other operating parameters is either able to be carried out just as easily with other means or does not make possible any resetting that can be implemented intuitively.

A development is that modifications of an operating parameter are especially able to be reset if this operating parameter can assume more than two values. That an operating parameter can assume more than two values can especially mean that it includes an operating parameter range, e.g. a number of heat settings. However modifications of an operating parameter which can assume two or fewer values can basically also be reset.

The non-resettable modifications can especially include modifications which activate or switch in a function (e.g. activate a roasting sensor system) or trigger a sequence (e.g. starting a timer or of automatic programming). The non-resettable modifications can especially include modifications which are only used for appliance control (e.g. triggering of a "select" button or a menu button).

Another embodiment is that a resetting by the reset control element is only then able to be initiated if there is no incorrect actuation present. Thus a new modification following on directly from the resetting can be avoided because of the non-rectified incorrect actuation function.

A development is that a resetting by the reset control element is only then able to be initiated if there is no incorrect actuation of a resettable control element present. The reset control element might thus trigger and a resetting might however be carried out if an incorrect actuation of a non-resettable control element is present.

A development is also that the incorrect actuation is a permanent actuation. In such cases it is assumed that a specific control element does not have to be actuated for longer than a fourth predefined period of time and/or usually is not actuated for longer than the fourth predefined period of time. If a specific control element is actuated for as long as or for longer than the fourth predefined period of time, an incorrect actuation is assumed. This permanent actuation can for example be created by laying objects on the at least one control element or if electrically conductive liquid, e.g. noodle water, spills onto a capacitively-responsive sensor array. Another type of incorrect actuation, depending on operational control, might comprise a simultaneous actuation of a number of control elements for example.

Another embodiment is that the reset control element is coupled to a memory device, wherein the memory device is configured to store the at least one modification made most recently. This makes a simple resetting possible. The memory device might be a memory device assigned permanently to the reset control element for example or might be present as a memory area of a memory unit of a central control unit of the household appliance.

A development is to restore the at least one modification with a respective actuation of the resetting control element (and to do so into a memory or into memory areas in which the values of the operating parameters are able to be stored or are stored during operation of the household appliance). The restoring makes an especially simple resetting implementation possible.

A development is that at least one operating parameter is able to be modified automatically and with each (i.e. also an automatic) modification which it undergoes, is able to be stored or is stored. This also enables operating parameters which change over time to be reset to values valid immediately before a modification and not just to originally set values. Such a modification can also be an automatic modification of the operating parameter.

The at least one predefined operating parameter can include at least one ongoing period of time, especially a timer time and/or a cooking time.

A general development is also that only modifications which have been made by a manual actuation of a control element are able to be reset. Modifications made automatically, e.g. an automatic countdown of a period of time executed by a control device, are consequently not able to be reset by an actuation of the reset control element in such cases. In particular a change in a manual and automatically modifiable operating parameter might only be able to be reset if the modification has been made manually and otherwise the value of the operating parameter is only updated.

A further embodiment is that a storage of a modification is able to be deleted automatically (i.e. is deleted or is not even made at all) if the associated at least one operating parameter has not been modified by the modification. This might be the case for example for a modification of an operating parameter in which a target value corresponds to an initial value. This enables storage space to be saved and an operator is not confused during resetting by not recognizing any change on actuating the reset control element.

A development is that the storage of a modification is able to be erased automatically if the associated at least one operating parameter, without taking into account at least one modification carried out automatically, has not been changed by the modification. The storage of the modification is thus also able to be erased automatically if, since the last, modification undertaken manually, an operating parameter has automatically changed its setting.

The household appliance can basically comprise any household appliance, especially a cooking appliance, especially a cooker.

Another embodiment is that the household appliance is a cooker in the form of a cooking appliance with a cooktop. The invention is able to be implemented advantageously particularly for this embodiment, since many settings are specifically made and also modified during a cooking process.

For a cooking appliance in particular the following modifications are able to be reset for example: an adjustment of a heat setting, an adjustment of a zone switch-in, an adjustment of start to boil setting (especially its activation, if necessary also a period of time and/or a level) and/or an adjustment (including activation) of a timer time.

For example the following modifications might not be able to be reset: an activation of a time, an activation of a roasting sensor system, an activation of an automatic program, an activation of a selection/menu button, an activation of a child lock, an activation of a wipe protection (especially by an actuation of a respectively assigned control element) and/or an activation of the at least one hot plate by actuating the main switch.

Another development is that with a resetting of the at least one operating parameter an associated display of the value of the parameter is reset, if present. The display can e.g. be an alphanumeric display and/or a symbol display.

The object is achieved by a method for operating a household appliance, wherein at least one modification of an operating parameter recently carried out is able to be reset by an operator.

The method produces the same advantage as the household appliance and can also be embodied in a similar way. Thus the modification might be able to be carried out by means of actuating a reset control element. The at least one modification might also be able to be reset during normal operation.

BRIEF DESCRIPTION OF THE DRAWINGS

In the following figures the invention is described schematically in greater detail on the basis of an exemplary embodiment. In this embodiment, for the sake of clarity, the same elements or elements which act in the same way can be provided with the same reference characters.

DETAILED DESCRIPTION OF EXEMPLARY EMBODIMENTS OF THE PRESENT INVENTION

Figure 1:
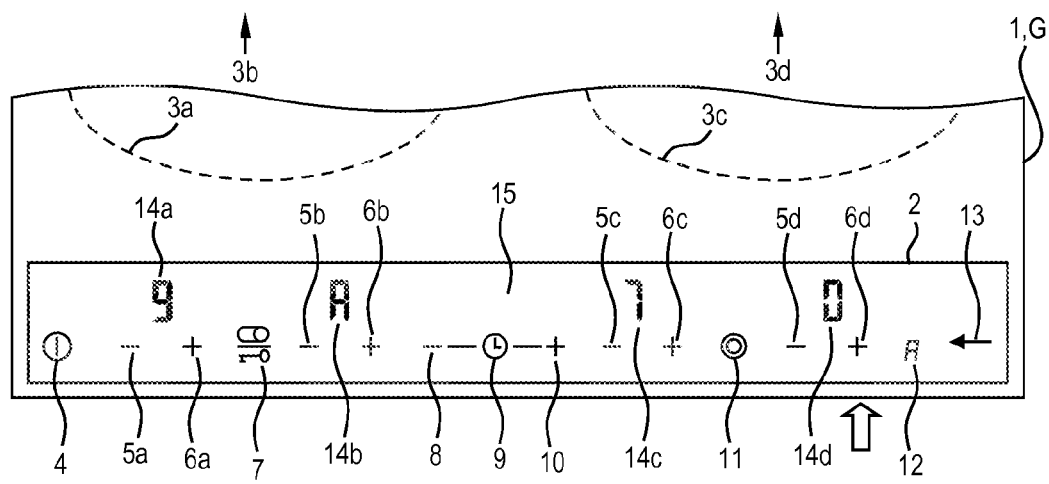
FIG. 1 shows an overhead view of a section of a cooktop with a view of a control panel, wherein the control panel is in a first actuation state.

FIG. 1 shows an overhead view of a section of a cooktop 1 of a cooking device G (e.g. a range cooker or a stand-alone cooktop) looking at a control panel 2, wherein the control panel 2 is in a first actuation state. Shown above the control panel 2 are two of a total of four hotplates 3a-d able to be operated by the control panel 2. The control panel 2 is embodied for example as a capacitive sensor array and has a number of (sensor) buttons 4, 5a-d, 6a-d, 7 to 13 arranged in a row and also display panels 14a-d and 15.

Individually these are a main switch 4 for switching the cooktop 1 on and off, arranged at a left-hand edge. In this case the cooking device G can continue to be supplied with power, e.g. to display an error condition, but at least the hot plates 3a, 3c are switched off.

Located to the right next to the main switch 4 is a reduction button or "−" button 5a for reducing the heat setting of the cooktop 3a. The heat setting can be reduced here for example between "9" (maximum power) and "0" (cooktop switched off) in full steps or half steps and/or also in predefined steps. The "−" button 5a has the repeat function, i.e. it reduces multiple times when actuated continuously.

Located to the right next to the "−" button 5a is an increase button or "+" button 6a to increase the heat setting of the cooktop 3a, maximally between "0" and "9". The "+" button 6a also has a repeat function, i.e. it increases the setting multiple times when actuated continuously.

Located to the right next to the "+" button 6a is a child lock button 7, which on actuation of a child lock suppresses actuation of the other buttons 4, 5a-d, 6a-d, 8 to 13. The child lock can be canceled again by actuating the child lock button 7 once again.

Located on the right next to the child lock button 7 are a "−" button 5b and a "+" button 6b, which are able to be actuated or function in a similar way to the "−" button 5a and the "+" button 6a, however now for the hot plate 3b located behind the hotplate 3a.

Located on the right next to the "+" button 6b are, in this order, a decrement timer button or "−" timer button 8, a timer activation button 9 and an increment timer button or "+" timer button 10. The timer activation button 9 enables a timer to be activated and the "−" timer button 8 and the "+" timer button 10 enable it to be adjusted, especially also decremented or incremented, possibly with a repeat function.

Located on the right next to the "+" timer button 10 are a "−" button 5c and a "+" button 6c, which are able to be actuated or function in a similar way to the "−" button 5a and the "+" button 6a, but now for the hotplate 3c.

Located on the right next to the "+" button 6c is a zone addition button 11, with which a hotplate expansion or cooking zone is able to be added to a hotplate, e.g. the hotplate 3d located behind the hotplate 3c.

Located on the right next to the zone addition button 11 are a "−" button 5d and a "+" button 6d, which are able to be actuated or function in a similar manner to the "−" button 5a and the "+" button 6a, but now for the hotplate 3d located behind the hotplate 3c.

Located on the right next to the "+" button 6c is a heat boost supplementary switch 12, with which a heat boost is able to be activated.

Located on the right next to the heat boost supplementary switch 12, and thus on the right-hand edge of the control panel 2, is a reset control element in the form of a reset button 13.

Located above the buttons 4, 5a-d, 6a-d, 7 to 13 are the display panels 14a-d and 15, and from left to right they are in this order: a single-segment display 14a for displaying a heat setting of the hotplate 3a, a single-segment display 14b for displaying a heat setting of the hotplate 3b, a two-digit timer display 15 for displaying the current timer time, a single-segment display 14c for displaying a heat setting of the hotplate 3c and a single-segment display 14d for displaying a heat setting of the hotplate 3d.

In the first actuation state shown the cooktop 1 is switched on, and hotplate 3a is at a heat setting of "9", hotplate 3b is performing a supplementary heat boost "A", hotplate 3c is at a heat setting of "7" and hotplate 3d is switched on, but is at a heat setting of "0". A zone connection for the hotplate 3d is active (associated lamp not shown).

By actuating the "+" button 6d, as indicated by the arrow in the diagram below the control panel 2, the heat setting of hotplate 3d can be increased from "0" to "9" and this can be done by a corresponding frequent actuation of the "+" button 6d or by use of the repeat function. The "+" button 6d (like the "+" buttons 6a to 6c), for a first actuation after the cooktop 1 is switched on, can set the heat setting to a predefined level and only on a subsequent actuation increase the heat setting in turn. Such a modification of an operating parameter, because of its sufficiently rapid sequence, counts as a single modification.

Figure 2:
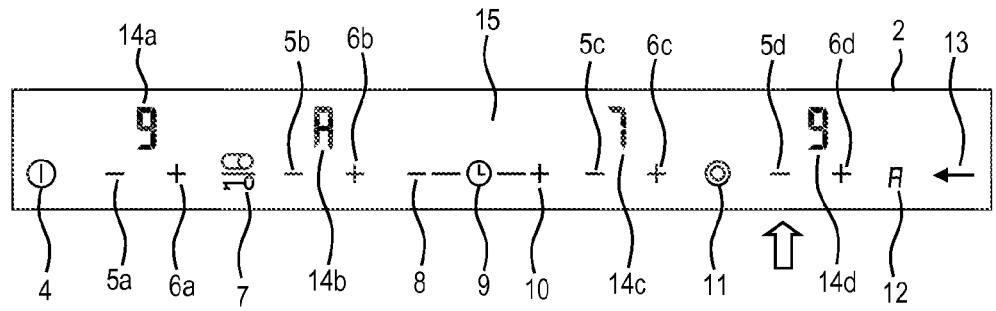
FIG. 2 shows the control panel in a second actuation state, in which, in addition to the first actuation state, a modification of an operating parameter has been made.
Figure 3:
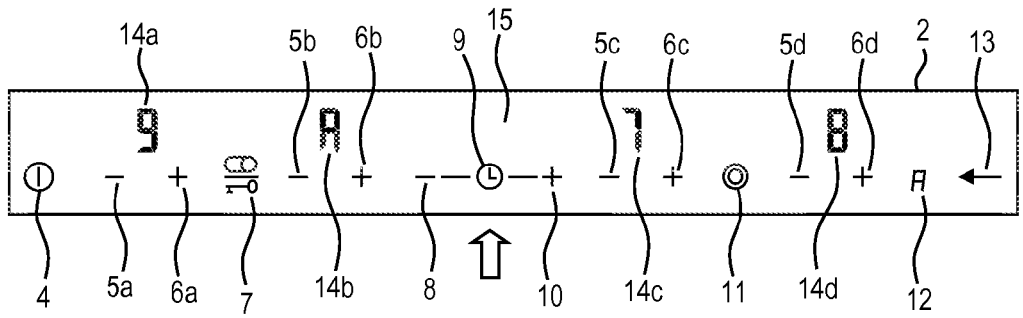
FIG. 3 shows the control panel in a third actuation state, in which, in addition to the second actuation state, a further modification of an operating parameter has been made.
Figure 4:
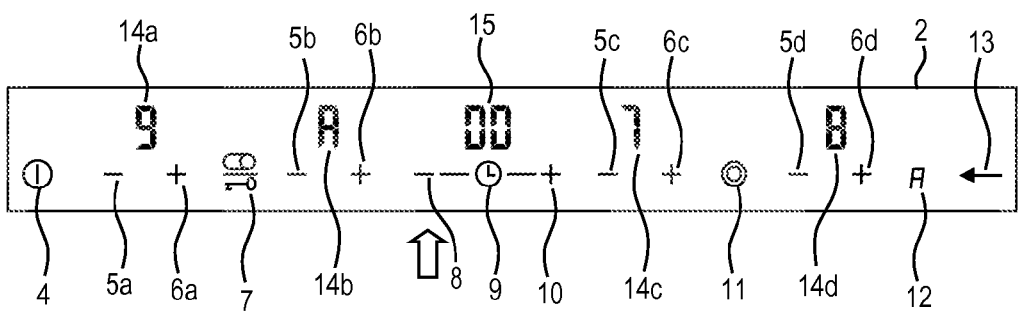
FIG. 4 shows the control panel in a fourth actuation state, in which, in addition to the third actuation state, yet another modification of an operating parameter has been made.
Figure 5:
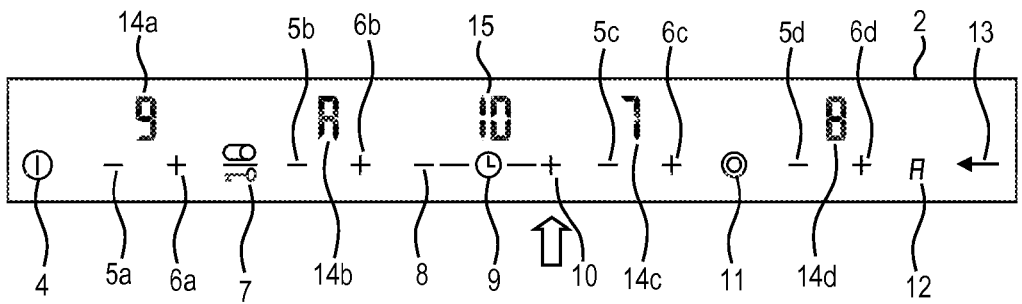
FIG. 5 shows the control panel in a fifth actuation state, in which, in addition to the fourth actuation state, yet another modification of an operating parameter has been made.

The correspondingly adjusted state of the operating panel 2 and thus also of the cooktop 1 is shown in FIG. 2. Now, as indicated by the arrow, the heat setting of the cooktop 3*d* can be reduced to "8" by at least a single, short actuation of the "−" button 5*d*, which is shown in FIG. 3. Subsequently the timer can be set by an actuation of the timer button 9, through which the timer display 15 is initially set to "00", which is shown in FIG. 4. The time can be incremented by actuating the "−" timer button 8 from the "00" in 10 steps or in other predefined time steps (e.g. to a value "10", as shown in FIG. 5) and through an (especially multiple) actuation of the "+" timer button 10 be adjusted in individual steps (steps of one minute) (e.g. to a value of "17", as shown in FIG. 6).

Figure 6:
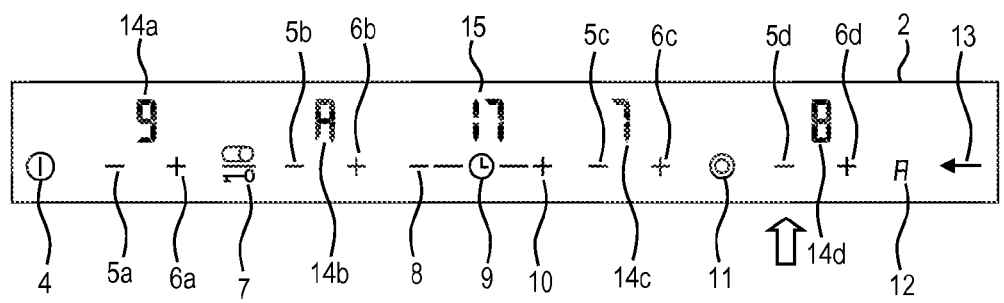
FIG. 6 shows the control panel in a sixth actuation state, in which, in addition to the fifth actuation state, yet another unintentional modification of an operating parameter has been made.

Due to the unintentional switching down of the heat setting of the hotplate 3*d* shown by the arrow in FIG. 6 by rapid consecutive actuations or made possible by the repeat function because of a corresponding actuation of the "−" button 5*d*, not only is the heat setting of the hotplate 3*d* adjusted, but also timers and possibly a previously activated zone addition are deactivated for this hotplate 3*d*. This is designed as a single modification. With this modification a number of operating parameters are thus modified by an actuation of just one actuation element.

Figure 7:
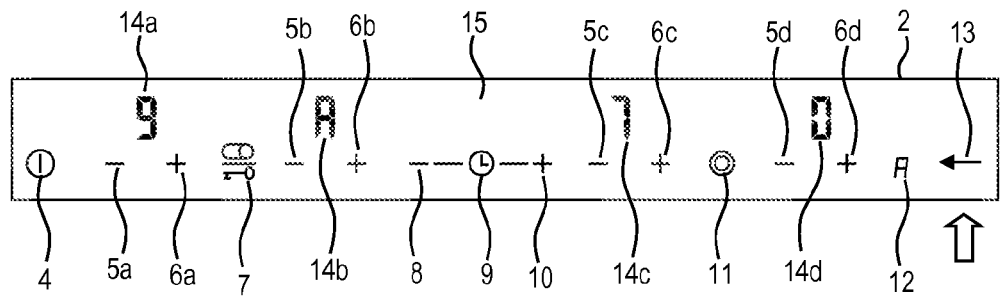
FIG. 7 shows the control panel in a seventh actuation state, in which, in addition to the sixth actuation state, yet another, unintentional modification of an operating parameter has been made.

Through the following actuation of the reset control element 13, as indicated by the arrow in FIG. 7, the modifications created by the last actuation of the "−"-button 5*d* are cancelled or reset, namely the associated heat setting of the hotplate 3*d* to "8", the timer is activated and again set to a value "17", as already shown in FIG. 6. The displays 14*d* and 15 are reset accordingly.

Actuating the reset control element 12 once more could enable further modifications (in the reverse order in which they were made) to be reset, e.g. the timer is then reset again to the value "10" etc. In such cases it is assumed that the changes made between the figures shown have been performed with an interval between them which is larger than a predefined first period of time of three seconds here for example.

Were the timer function already started, wherein the timer time is counted down by the cooking device G independently in minutes, and were the unintentional actuation of the "−" button 5*d* then to occur, by the actuation of the reset button 13 the associated heat setting of the hotplate 3*d* would be reset to "8", the timer activated and reset to the then current value (which can also be smaller than "17").

Naturally the present invention is not restricted to the exemplary embodiment shown.

Thus the invention is not restricted to sensor arrays.

The control panel can also have further characteristics, e.g. illustrated in the general description part.

Then, starting from FIG. 1, a switching-off of the main switch is undertaken (all hotplates to heat setting "0", i.e. switched off, corresponding segment displays 14*a-d* to display "0", timer display 15 deactivated, no additional functions such as a zone addition, a timer or a supplementary heat boost activated), by actuating the reset button 13 the setting of the cooktop 1 in accordance with FIG. 1 can be restored or reset, if the reset button 13 is actuated within five minutes, possibly only after a renewed actuation of the main switch 4.

The invention claimed is:

1. A household appliance, comprising:
   at least one physical control element operable to input a sequence of a plurality of modifications, each of which modify at least one operating parameter of the household appliance, wherein the at least one operating parameter includes at least one of a heat setting and timer, and
   a physical reset control element configured to reset, within a predefined period of time, a most recently made modification of the at least one operating parameter from a sequence of recently made modifications of the at least one operating parameter modified by the at least one physical control element,
   wherein the most recently made modification is carried out within the predefined period of time.

2. The household appliance of claim 1, wherein the physical reset control element is configured to reset a number of modifications most recently made from the plurality of modifications of the at least one operating parameter made using the at least one physical control element.

3. The household appliance of claim 1, wherein the at least one operating parameter is modified as a result of an actuation of the control element.

4. The household appliance of claim 1, wherein the at least one operating parameter is modified as a result of a number of actuations of the at least one physical control element carried out consecutively, wherein the number of actuations are carried out consecutively within the predefined period of time.

5. The household appliance of claim 4, wherein the predefined period of time amounts to at least three seconds.

6. The household appliance of claim 1, wherein the predefined period of time is approximately five minutes.

7. The household appliance of claim 1, wherein the at least one most recently made modification is resettable after the household appliance has been switched off, up to another predefined period of time.

8. The household appliance of claim 1, further comprising a memory device coupled to the physical reset control element, said memory device being configured to store the most recently made modification and to restore the most recently made modification by actuation of the physical reset control element.

9. The household appliance of claim 1, further comprising a memory device coupled to the physical reset control element, said memory device being configured to store the at least one operating parameter with each modification which it undergoes.

10. The household appliance of claim 9, wherein the at least one operating parameter is at least one current period of time.

11. The household appliance of claim 8, wherein the memory device is configured to automatically erase storage of the most recently made modification, when the at least one operating parameter has not been changed by the modification.

12. The household appliance of claim 1, constructed in the form of a cooking device with a cooktop.

13. The household appliance of claim 1, wherein the operating parameter is selected from the group consisting of adjustment of a heat setting, adjustment of a zone addition, adjustment of a heat boost and adjustment of a timer time.

14. The household appliance of claim 1, wherein the operating parameter is selected from the group consisting of activation of a timer, activation of a roasting sensor system, activation of an automatic program system, activation of a selection/menu button, activation of a child lock, activation of a wipe protection and activation of a hotplate by actuating a main switch.

15. The household appliance of claim 1, wherein the at least one physical control element is a control panel of a sensor array and the physical reset control element is a control area of a sensor array.

16. A method for operating a domestic appliance, comprising:
   receiving, via at least one physical control element, a sequence of two or more inputs to modify at least one operating parameter of the domestic appliance, wherein the at least one operating parameter includes at least one of a heat setting and timer; and
   in response to receiving an input via a physical reset control element, resetting, within a predefined period of time, a most recently executed modification of the at least one operating parameter from a sequence of recently made modifications of the at least one operating parameter made using the at least one control element,
   wherein the most recently made modification is carried out within the predefined period of time.

17. The method of claim 16, wherein the most recently executed modification is resettable at least during normal operation.

18. A household appliance, comprising:
   a cooking device, wherein the cooking device comprises a cooktop surface;
   at least one physical control element operable to input a sequence of a plurality of modifications, each of which modify at least one operating parameter of the cooking device, wherein the at least one operating parameter includes at least one of a heat setting and timer; and
   a physical reset control element configured to reset, within a predefined period of time, a most recently made modification of the at least one operating parameter from a sequence of recently made modifications of the at least one operating parameter modified by the at least one physical control element,
   wherein the most recently made modification is carried out within the predefined period of time.

* * * * *